United States Patent [19]

Yamada

[11] Patent Number: 4,558,364
[45] Date of Patent: Dec. 10, 1985

[54] SURFACE ACOUSTIC WAVE DEVICE
[75] Inventor: Jun Yamada, Yokohama, Japan
[73] Assignee: Hitachi, Ltd., Tokyo, Japan
[21] Appl. No.: 495,494
[22] Filed: May 17, 1983
[30] Foreign Application Priority Data
  May 19, 1982 [JP] Japan ................................. 57-83067
[51] Int. Cl.$^4$ .......................... H04N 5/44; H03H 9/64
[52] U.S. Cl. .................................... 358/188; 358/196; 333/193; 333/194; 333/195
[58] Field of Search ............... 358/21 R, 39, 188, 189, 358/191.1, 195.1, 196, 197, 198, 904, 905; 333/150, 153, 193, 194, 195; 455/333, 307

[56] References Cited

U.S. PATENT DOCUMENTS 4,006,290  2/1977  Momberger ........................ 358/196
4,420,730 12/1983  Wakatsuki ........................... 333/195
4,480,237 10/1984  Yamada .............................. 333/193

FOREIGN PATENT DOCUMENTS 22435  2/1979  Japan .

OTHER PUBLICATIONS

Geigen Links Dirigent Mitte Celli Rechts, by S. Fernsehen, Funkschau, 6/1981, pp. 55-56.

Primary Examiner—Tommy P. Chin
Attorney, Agent, or Firm—Antonelli, Terry & Wands

[57] ABSTRACT

A surface acoustic wave device comprises first interdigital electrodes for converting an electrical signal into a surface acoustic wave, a medium for propagation of the surface acoustic wave generated by the first interdigital electrodes, and second and third interdigital electrodes which again convert the surface acoustic wave into electrical signals. The second interdigital electrodes, acting as output electrodes for a picture signal, have an electrode aperture length which is larger than that of the third interdigital electrodes acting as output electrodes for a sound signal. The second interdigital electrodes have an electrical capacitance between a pair of electrode fingers in unit length which is larger than that of the third interdigital electrodes.

6 Claims, 4 Drawing Figures

SURFACE ACOUSTIC WAVE DEVICE

This invention relates to a surface acoustic wave device for use in a television receiver set or the like.

With the recent trend of practicing sound multiplexing in television broadcasting, it has become desirable to improve sound quality. An approach to this end is disclosed in "Funkschau, 6/1981", according to which a surface acoustic wave filter is used to extract a sound signal component and a picture carrier component from a tuner output while suppressing a picture signal component relatively, and sound reproduction is effected on the basis of the two extracted components. Meanwhile, Japanese Utility Model Publication No. 22435/79 discloses a surface acoustic wave filter adapted for separation of a tuner output into a picture channel and a sound channel, which filter comprises a piezoelectric substrate on which are disposed one input transducer connected to a tuner, and two output transducers for receiving surface acoustic waves and converting them into electrical signals. In this example, the two output transducers are designed to have the same electrode aperture length probably because it is intended to make the impedance of one output transducer for the sound signal identical with the impedance of the other output transducer for the picture signal, the latter impedance being set for suppression of multipath reflection. For this reason, the area of the substrate is approximately doubled as compared to that of a substrate carrying a single output transducer. Accordingly, this example of a composite surface acoustic wave filter inevitably requires a doubled quantity of substrate material, resulting in an increase not only in production cost but also in the size of a packaged device, and can not be applied to conventional packaged devices used.

In addition, the generation of multipath reflection is inevitable in the surface acoustic wave filter. Multipath reflective wave interferes with a main signal and is delivered out of the filter. To suppress such multipath reflective wave, it is common practice to couple the filter to a succeeding amplifier in an impedance mismatching fashion. The impedance mismatching coupling can suppress the multipath reflection wave but it will adversely attenuate the main signal. Thus, when in the example of the aforementioned Japanese Publication the sound and picture signal channels are brought into the same impedance coupling relationship, the suppression of multipath reflective wave can be accomplished only at the cost of the undesirable attenuation of the sound signal component.

An object of the present invention is to provide a surface acoustic wave filter capable of transmitting a sound signal without causing attenuation.

Another object of the present invention is to provide a surface acoustic wave filter without an increase in the area of the filter substrate.

According to the present invention, in a surface acoustic wave filter for separating a picture signal component and a sound signal component, multipath reflective wave is suppressed in a picture signal channel only, and an output transducer provided for a sound signal channel is so spaced apart from an input transducer that the delay time of the multipath reflective wave can be reduced to an extent that occurrence of the multipath reflective wave can not be discriminated and is conditioned to have a short electrode aperture length by making its output impedance high to thereby prevent attenuation of the sound signal due to impedance mismatching with a succeeding amplifier.

In the surface acoustic wave device, there occurs a multipath reflective wave called a triple transit echo (TTE) between the input and output transducers. This reflective wave is delayed with respect to a desired surface acoustic wave signal to reach the output transducer and turns into a ghost. Therefore, in a conventional surface acoustic wave device, circuit constants of a filter and a succeeding circuit are so selected as to purposely establish an impedance mismatching therebetween and hence the unwanted TTE can be suppressed only at the cost of an increased loss in the device. However, in a system for separation of a picture signal and a sound signal components, the TTE must be suppressed, like the conventional device, in the picture signal channel whereas the occurrence of the TTE in the sound signal channel is not serious if the delay time of the TTE is so short that human ears may be insensitive to the TTE. More particularly, when the period of comb like characteristics for the TTE as defined by a reciprocal of the delay time between the desired signal and TTE is very large, amounting to, for example, 500 KHz of the TTE's interval for a sound signal of a band width of about 15 KHz, the frequency characteristics for the sound signal are not affected by the TTE comb like characteristics so that the sound signal can be substantially freed from distortion. Accordingly, for the sound signal channel of a band width which is far narrower than that of the picture signal channel of the order of 4 MHz, the establishment of impedance matching between the output transducer and the succeeding amplifier is significantly effective for both the size reduction of the surface acoustic wave device and prevention of the signal attenuation.

The present invention will be apparent from the following detailed descriptions taken in conjunction with the accompanying drawings, in which.

Figure 1:
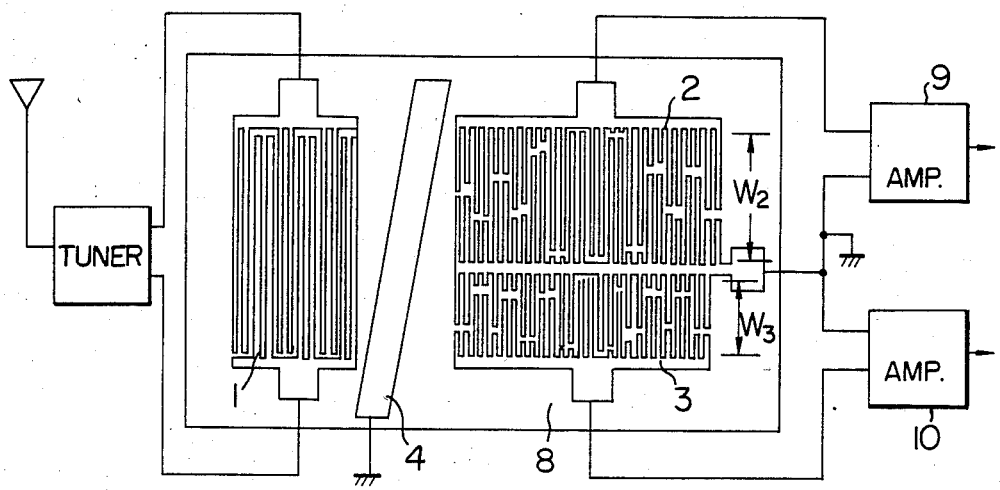
FIG. 1 is a plan view showing an embodiment of a surface acoustic wave device according to the present invention.

Referring to FIG. 1, a preferred embodiment of a surface acoustic wave device according to the present invention comprises an input transducer 1, a picture signal output transducer 2 and a sound signal output transducer 3. The input transducer 1 has 15 pairs of unapodized electrodes in which the finger width is 8.6 $\mu$m and the finger spacing and finger overlapping length are fixed, and its electrode aperture length is 2260 $\mu$m. The picture signal output transducer 2 has 60 pairs of apodized electrodes in which the finger spacing and finger overlapping length are not uniform, and the sound signal output transducer 3 has 70 pairs of apodized electrodes in which the finger spacing and finger overlapping length are also not uniform. The output transducer 2 has an electrode aperture length $W_2$ of 1280 $\mu$m and the output transducer 3 has an electrode aperture length $W_3$ of 680 $\mu$m. The electrode finger of each transducer is of a double finger configuration (split type) and is made of aluminum deposited films of 5000 Å thickness formed by a photolithographic technique on a surface of a piezo-electric substrate 8 made of a lithium niobate single crystal of 128° rotated Y-axis cut. Interposed between the input and output transducers is a shield electrode 4.

Figure 2:
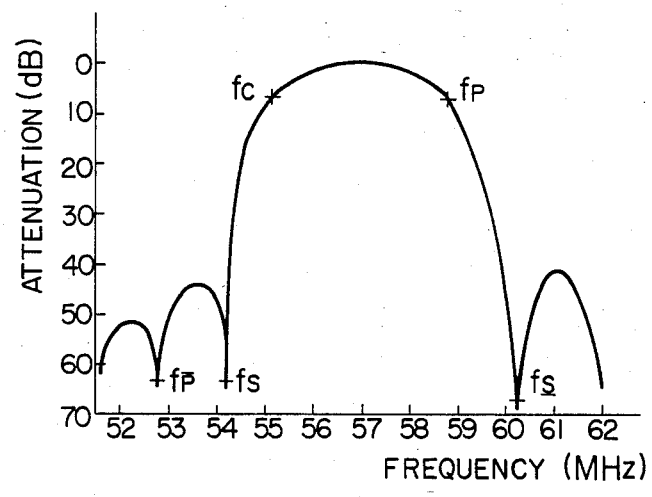
FIGS. 2 and 3 are graphic representations showing the characteristics of transmission channels in the device of FIG. 1.
Figure 3:
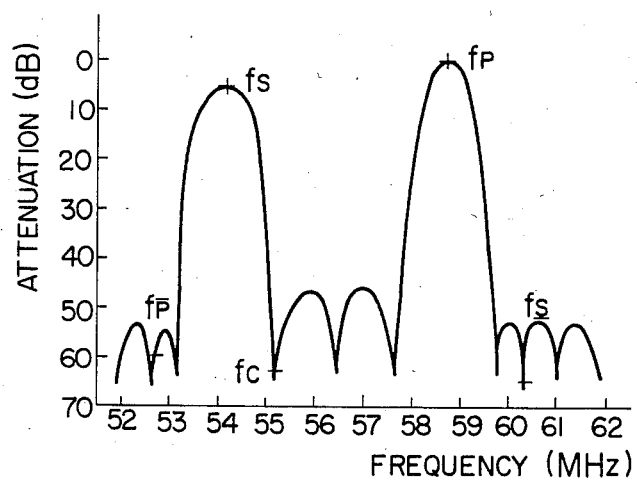

The input transducer 1 cooperates with the output transducer 2 to provide frequency characteristics are shown in FIG. 2 wherein a self channel sound carrier fs, an upper adjacent picture carrier $\overline{fp}$ and a lower adjacent sound carrier $\underline{fs}$ are suppressed. The input transducer 1 is also in cooperation with the output transducer 3 to provide frequency characteristics as shown in FIG. 3 wherein other frequency components than the sound carrier fs and a picture carrier fp are suppressed. A picture signal component from the output transducer 2 is supplied to an amplifier 9, and a sound signal component and a picture carrier both delivered out of the output transducer 3 are supplied to an amplifier 10. Output signals of the amplifiers 9 and 10 are respectively subjected to necessary signal processing and then supplied to a picture tube and a loudspeaker, respectively. Each of the amplifiers 9 and 10 has an input impedance of about 300 Ω and on the other hand, the output transducer 2 has an output impedance of about 150 Ω and the output transducer 3 has an output impedance of about 300 Ω. Therefore, while in the picture signal channel the TTE can be suppressed because of the impedance mismatching, a main signal and the TTE can not at all be suppressed in the sound signal channel where the impedance matching is completely established. However, the output transducer 3 is disposed in close proximity of the input transducer 1 so that the delay time of the TTE may be of the order of several micro seconds at the most and human ears may be completely insensitive to the interfering TTE. The transducer can be conditioned to assume a high impedance by reducing the electrical capacitance between paired fingers, and to this end, the duty factor defined by a ratio of finger width to structural period of interdigital electrodes can be reduced. For example, when the electrode aperture length is 980 μm, the finger width is 8.5 μm and the finger spacing is 8.5 μm with the duty factor measuring 50%, the electrical capacitance is 13 pF. For the same electrode aperture length, however, the electrical capacitance is 7 pF when the finger width is 4.5 μm and the finger spacing is 13.5 μm with the duty factor measuring 25%. Therefore, it is possible to realize a high impedance by reducing both the electrode aperture length and the duty factor.

Figure 4:
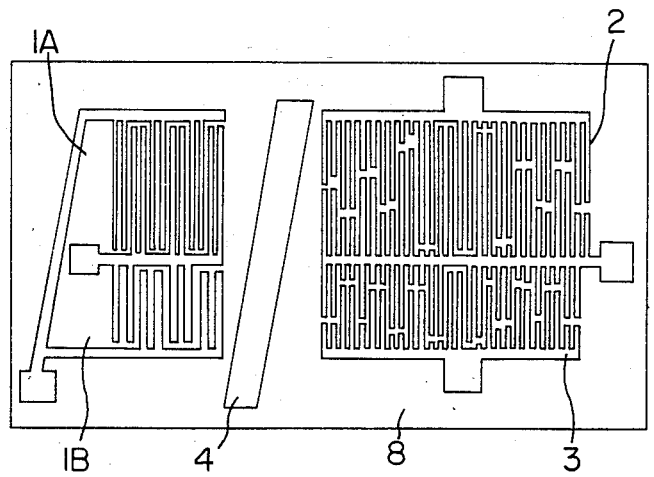
FIG. 4 is a plan view showing another embodiment of the surface acoustic wave device according to the invention.

FIG. 4 shows, in plan view, another embodiment of the present invention.

This embodiment is the same as the FIG. 1 embodiment except that an input transducer 1 is divided into sub-transducers 1A and 1B and the sub-transducer 1B has characteristics which are more fitted for the sound signal channel.

As described above, according to the present invention, the chip size of the piezo-electric substrate carrying the filter electrodes can be reduced in the longitudinal direction so as to measure 3.2 mm which is smaller by 0.8 mm than 4 mm of the prior art device and hence the output number of chips produced from a single substrate can be increased to greatly contribute to cost reduction. Further, the output voltage level of sound signal can be approximately doubled, thereby improving the electrical characteristics.

I claim:

1. A surface acoustic wave device comprising: a piezo-electric substrate;

an input transducer means, in the form of a pair of interdigital electrodes, disposed on the piezo-electric substrate, for receiving a television signal containing a picture signal component of a wide band width and a sound signal component of a narrow band width and generating a surface acoustic wave corresponding to the television signal;

a first output transducer means, in the form of a pair of interdigital electrodes, being disposed on the piezo-electric substrate, said first output transducer receiving the surface acoustic wave and converting the surface acoustic wave into an electrical signal containing the picture signal component; and a second output transducer means, in the form of a pair of interdigital electrodes, being disposed on the piezo-electric substrate, extending in a direction orthogonal to a propagation direction of the surface acoustic wave and being located in close proximity to said first output transducer, said second output transducer means receiving the surface acoustic wave and converting the surface acoustic wave into an electrical signal containing the sound signal component, said second output transducer having an output impedance which matches a succeeding amplifier and being spaced apart from said input transducer such that the period of comb like characteristics defined as a reciprocal of the delay time of a multipath reflective wave has no substantial influence upon the narrow band width characteristics of the sound signal component.

2. A surface acoustic wave device according to claim 1 wherein said second output transducer means has an electrode aperture length which is shorter than another electrode aperture length of said first output transducer.

3. A surface acoustic wave device according to claim 2 wherein said second output transducer means has paired interdigital electrodes of a duty factor of 25%.

4. A surface acoustic wave device according to claim 1 further comprising electrical shield means interdisposed between said input transducer means and said first and second output transducer means.

5. A surface acoustic wave device comprising:

a substrate of piezo-electric material;

an input transducer means having a first comb of electrodes disposed on said subtrate and connected to a signal source of an intermediate frequency signal having a video signal component and an audio signal component, for generating a surface acoustic wave corresponding to said intermediate frequency signal;

a first output transducer means having a second comb of electrodes disposed on said substrate and connected to a video signal processing circuit, for applying said video signal component converted from a received surface acoustic wave to said video processing circuit; and a second output transducer means having a third comb of electrodes disposed on said substrate and connected to an audio signal processing circuit with an output impedance for matching an input impedance of said audio processing circuit, for applying said audio signal component converted from said received surface acoustic wave to said audio processing circuit, said second output transducer means being spaced apart from said input transducer means such that a half of the reciprocal of a propagation time during which said surface acoustic wave propagates a distance between said input transducer means and said second output transducer means is greater than a frequency band width of said audio signal component.

6. An intermediate frequency circuit for a television receiver comprising:
 a signal source for providing an intermediate frequency signal including a video signal component and an audio signal component;
 a video channel circuit for processing said video signal component;
 an audio channel circuit for processing said audio signal component;
 a surface acoustic wave device including a substrate of piezo-electric material, an input transducer means having a first comb of electrodes disposed on said substrate and connected to said signal source for generating a surface acoustic wave corresponding to said intermediate frequency signal, a first output transducer means having a second comb of electrodes disposed on said substrate and connected to said video channel circuit for applying said video signal component converted from a received surface acoustic wave to said video channel circuit, and a second output transducer means having a third comb of electrodes disposed on said substrate and connected to said audio channel circuit with an output impedance for matching an input impedance of said audio channel circuit, for applying said audio signal component converted from said received surface acoustic wave to said audio channel circuit, said second output transducer being spaced apart from said input transducer means such that a half of the reciprocal of a propagation time during which said surface acoustic wave propagates a distance between said input transducer means and said second output transducer means is greater than a frequency band width of said audio signal component.

* * * * *